(12) United States Patent
Fork et al.

(10) Patent No.: US 9,004,001 B2
(45) Date of Patent: Apr. 14, 2015

(54) INTERDIGITATED FINGER COEXTRUSION DEVICE

(75) Inventors: David K. Fork, Mountain View, CA (US); Karl Littau, Palo Alto, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 180 days.

(21) Appl. No.: 12/972,370

(22) Filed: Dec. 17, 2010

(65) Prior Publication Data

US 2012/0156364 A1    Jun. 21, 2012

(51) Int. Cl.
*B05C 1/00* (2006.01)
*B05C 3/02* (2006.01)
*B29C 47/06* (2006.01)
*B01F 5/06* (2006.01)
*B29C 47/02* (2006.01)
*B29C 47/70* (2006.01)
*B21C 3/00* (2006.01)
*B81C 99/00* (2010.01)
*B29C 47/00* (2006.01)
(Continued)

(52) U.S. Cl.
CPC .............. *B29C 47/061* (2013.01); *B01F 5/0604* (2013.01); *B29C 47/026* (2013.01); *B29C 47/062* (2013.01); *B29C 47/065* (2013.01); *B29C 47/707* (2013.01); *B81C 99/0015* (2013.01); *Y10S 425/049* (2013.01); *B29C 47/0019* (2013.01); *B29L 2031/3468* (2013.01); *B29L 2031/7146* (2013.01)

(58) Field of Classification Search
USPC ............. 425/131.1, 133.1, 133.5, 463, 131.5, 425/192 R, 376.1, 462; 264/171.1, 176.1, 264/173.15; 118/411; 156/267; 422/129, 422/191; 29/890.07
See application file for complete search history.

(56) References Cited

U.S. PATENT DOCUMENTS 3,195,865 A * 7/1965 Harder .......................... 366/337
3,382,534 A * 5/1968 Veazey ....................... 425/131.5
(Continued)

FOREIGN PATENT DOCUMENTS

EP          0802034       10/1997
EP          1757429        2/2007
(Continued)

*Primary Examiner* — Dah-Wei D Yuan
*Assistant Examiner* — Karl Kurple
(74) *Attorney, Agent, or Firm* — Marger Johnson & McCollom PC

(57) ABSTRACT

A co-extrusion device has at least one first inlet port to receive a first material, at least one second inlet port to receive a second material, a first combining channel arranged to receive the first material and the second material and combine the first and second materials into a first combined flow flowing in a first direction. a splitter channel arranged to receive the first combined flow and to split the first combined flow into at least two split flows in a second direction at least partially orthogonal to the first direction, wherein each split flow consists of the first and second materials, and a second combining channel arranged to receive the split flows and combine the split flows into a second combined flow in the first direction, and at least one exit orifice arranged to allow the materials to exit the device as a single flow. A method for depositing a structure comprising interdigitated materials includes merging flows of at least two materials in a first direction into a first combined flow, dividing the first combined flow in a second direction to produce at least two separate flows, wherein the second direction is perpendicular to the first direction, and merging the two separate flows into a second combined flow.

6 Claims, 8 Drawing Sheets

(51) Int. Cl.
*B29L 31/34* (2006.01)
*B29L 31/00* (2006.01)

(56) References Cited

U.S. PATENT DOCUMENTS

| | | | | |
|---|---|---|---|---|
| 3,583,678 | A * | 6/1971 | Harder | 366/340 |
| 3,752,616 | A * | 8/1973 | Matsui et al. | 425/131.5 |
| 3,860,036 | A * | 1/1975 | Newman, Jr. | 138/45 |
| 3,949,970 | A * | 4/1976 | ter Braak | 366/339 |
| 4,112,520 | A * | 9/1978 | Gilmore | 366/337 |
| 4,222,671 | A * | 9/1980 | Gilmore | 366/337 |
| 4,511,528 | A * | 4/1985 | Kudert et al. | 264/328.8 |
| 5,094,793 | A * | 3/1992 | Schrenk et al. | 264/173.15 |
| 5,143,681 | A * | 9/1992 | Daubenbuchel et al. | 264/515 |
| 5,154,934 | A | 10/1992 | Okamoto | |
| 5,628,950 | A * | 5/1997 | Schrenk et al. | 264/241 |
| 5,843,385 | A * | 12/1998 | Dugan | 422/602 |
| 5,851,562 | A * | 12/1998 | Haggard et al. | 264/172.17 |
| 5,882,694 | A * | 3/1999 | Guillemette | 425/133.1 |
| 6,109,006 | A * | 8/2000 | Hutchinson | 53/452 |
| 6,676,835 | B2 * | 1/2004 | O'Connor et al. | 210/542 |
| 6,981,552 | B2 * | 1/2006 | Reddy et al. | 166/294 |
| 7,090,479 | B2 * | 8/2006 | Kegasawa et al. | 425/133.5 |
| 7,690,908 | B2 * | 4/2010 | Guillemette et al. | 425/133.5 |
| 7,700,019 | B2 | 4/2010 | Lavoie et al. | |
| 7,765,949 | B2 | 8/2010 | Fork et al. | |
| 7,780,812 | B2 * | 8/2010 | Fork et al. | 156/267 |
| 7,799,371 | B2 | 9/2010 | Fork et al. | |
| 7,883,670 | B2 * | 2/2011 | Tonkovich et al. | 422/129 |
| 7,922,471 | B2 | 4/2011 | Fork et al. | |
| 8,206,025 | B2 * | 6/2012 | Natarajan | 366/146 |
| 2002/0074972 | A1 | 6/2002 | Narang et al. | |
| 2002/0176538 | A1 | 11/2002 | Wimberger-Friedl et al. | |
| 2003/0111762 | A1 * | 6/2003 | Floyd et al. | 264/136 |
| 2003/0189758 | A1 | 10/2003 | Baer et al. | |
| 2010/0239700 | A1 | 9/2010 | Winroth | |
| 2012/0153211 | A1 | 6/2012 | Fork et al. | |

FOREIGN PATENT DOCUMENTS

| | | |
|---|---|---|
| FR | 1308573 | 11/1962 |
| JP | 9183147 | 7/1997 |
| JP | 2006326891 | 12/2006 |
| WO | 0121688 | 3/2001 |

* cited by examiner

INTERDIGITATED FINGER COEXTRUSION DEVICE

BACKGROUND

Numerous devices such as batteries, fuel cells, electrical interconnects and others can benefit from tightly spaced interdigitated stripes of dissimilar materials. The term 'stripe' as used here means a line or other shape of material that contains only that material. It does not mix with adjacent stripes of other materials.

Issues arise when trying to produce tightly spaced interdigitated stripes. In one approach, flow focusing compression produces fine features of functional material in paste form. Examples of this approach can be found in U.S. Pat. No. 7,765,949, issued Aug. 3, 2010; and U.S. Pat. No. 7,799,371, issued Sep. 21, 2010. The approach taken in these patents relates to combining materials into 'co-laminar' flows, where three laminar flows of two different materials are brought together to form one flow, but where the two materials do not mix together. This approach suffices in application where the features are on the order of tens of microns arrayed on a millimeter scale pitch. For example, a solar cell may have a width of 156 mm and about 80 gridlines, each about 50 microns wide separated by almost 2 mm from a neighboring gridline.

In contrast, the interdigitated structures called for in the design of electrodes for energy storage devices may require micron scale features interleaved on the micron scale. For example, a typical cathode structure may involve interleaved structures that are 5 microns wide and 100 microns tall. An electrode structure may be 300 mm wide and 60,000 interleaved fingers of dissimilar materials. To dispense these materials from separate nozzles or in from multi-material slot containers would be impractical.

DETAILED DESCRIPTION OF THE EMBODIMENTS

In order to attain an interdigitated structure having micron features on a micron scale, it is possible to combine and focus two or more flows, split the combined flow into separate combined flows and then recombine and further focus the flows in repeated stages. This discussion will refer to the fluidic process that produces interdigitated flows of dissimilar fluids as 'fluid folding.' This discussion may also refer to the fluidic structure that performs the operations of combining, focusing, splitting, and recombining, etc., as a 'folding cascade.'

The term 'focusing' as used here means the combining of two or more flows of dissimilar fluids into a combined flow that has a lateral extent across the width of the combined flow at least less than the combined lateral extent of the flows prior to combination. Typically the width of the combined flow after focusing has a lateral extent that approximately equals the lateral extent across one of the flows prior to combination. For example, if a combined flow consists of one 'stripe' or finger each of material A and material B, the combined flow will have a lateral extent of measure X. When the flow is split and then recombined, now having two stripes each of materials A and B interleaved, the lateral extent of this flow will have the same lateral extent X of the previous flow.

Figure 1:
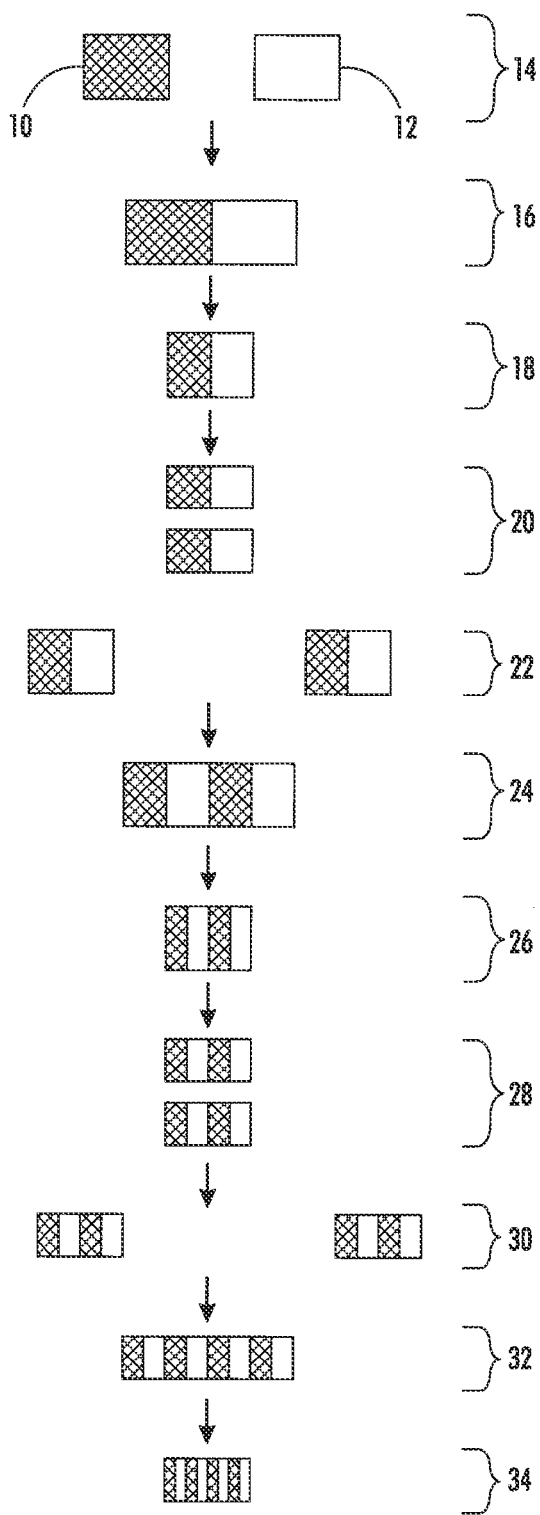
FIG. 1 shows a block diagram of a fluid flow of two materials into an interdigitated single flow.

FIG. 1 shows a cross sectional diagram of a flow of two materials. All flows in FIG. 1 are in the direction of the axis that runs perpendicular to the page. All flows are shown in cross section coming out of the page. Material A, 10, and material B, 12, flow separately from each other at stage 14. They then combined at stage 16 to form a first combined flow. This flow is focused at stage 18. It should be noted that the combining and focusing may occur simultaneously or stepwise within the cascade.

At stage 20, the combined flow splits into two separate combined flows. Note that the cascade is three dimensional, so the splitting occurs in a direction orthogonal to both the flow direction and the initial combining and focusing, that is, up and down in the figure.

The two combined flows move separately from each other and are directed to be in lateral proximity at stage 22. At stage 24, the two separate combined flows are combined into a second combined flow, which is then focused at stage 26. This combined flow is then split again at stage 28 in a similar or identical fashion as at stage 20, separated at stage 30 and then recombined at stage 32. At 34, the combined flow is then focused. While this process may repeat as many times as desired, only limited by the ability of the materials to remain separated from each other with no complete mixing when combined, at some point the combined flow will exit the cascade as a single flow through an exit orifice or nozzle. An advantage of this technique lies in its ability to produce material features much smaller and more numerous than the fluidic channels that convey them.

Figure 2:
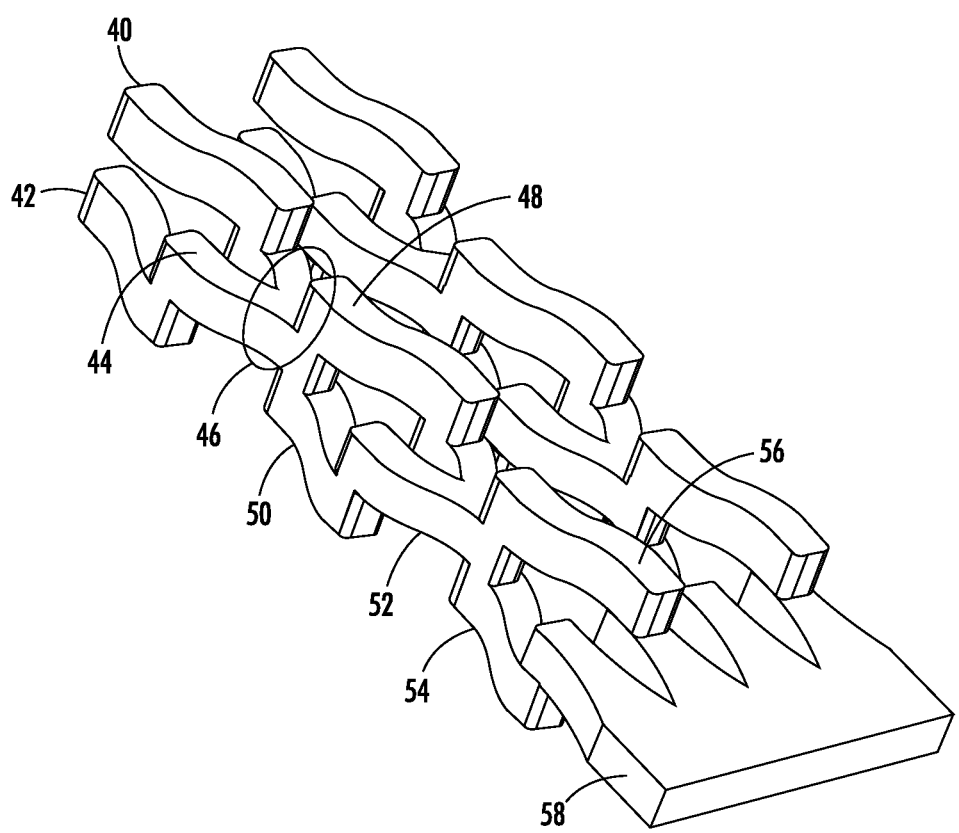
FIG. 2 shows an isometric view of an embodiment of a fluid path.

FIG. 2 shows an embodiment of a cascade. A first material enters the cascade through channel 40, and a second material enters the cascade through a channel 42. Note that these channels, referred to as separating channels as they separate or maintain the separation between flows, may curve to one side or the other and change levels. The two flows are combined using a combining channel 44. As discussed above, the combining channel has a focusing region 46 in which the combined flow is compressed or focused into a channel having a lateral extent approximately equal to the lateral extent of either of the individual separating channels 40 and 42.

The combined flow is then split into two separate combined flows at the junction of the combining channel 46 and the splitter channels 50 and 48. As shown in FIG. 2, the splitter channels split the flows in a direction orthogonal to the direction of the combined flow in the combining channel 46. In this example, the combined flow is split 'up' and 'down' relative to the combining channel 46. The direction may not be fully orthogonal, but may be partially orthogonal, such as going upwards at an angle between straight up and straight ahead. Each combined flow in the splitting channels 50 and 48 consists of a stripe or finger of the first material and a stripe or finger of the second material. As mentioned above, the device is three dimensional and may be formed from layers.

The two separated combined flows are recombined into a second combined flow by combining channel 52, which also focuses the second combined flow. The second combined flow in this example consists of four interleaved fingers, two each of the first and second materials. A second set of splitter channels, 56 and 54 then split the second combined flow into two separate combined flows. The structure 58 includes another combining channel, forming a third combined flow of 8 interleaved fingers, 4 each of the first and second materials. Optionally the structure 58 may also include an exit orifice with chamfered walls to allow the combined flow to exit the cascade as a single flow.

In operation, looking at FIG. 2, a first material enters the cascade at layer +1 at 40. The combining layer acts as the reference layer 0. A second material then enters the cascade at layer −1 42. These two materials combine into combined flow at layer 0, in this case at Y structure 46. Note that the combined flow consists of two stripes of material, one each of the first and second materials. Splitter channels 48 and 50 then separate the combined flow into two separate combined flows, each flowing into layers +1 and −1. The layers then recombine into a second combined flow at 52. Note that the combined flow now has 4 stripes of material, 2 each of the first and second materials.

One should note that the structure of FIG. 2 may have abrupt transitions between the layers. This may result in dead volumes in the corners of the various transitions where the materials congregate in the corners initially and the remaining flow passes by the congregated material. However, over time, and with the device starting and stopping, the congregated material may harden or otherwise clog the exit orifices. In addition these abrupt transitions may induce flow irregularities which can lead to substantial or complete mixing of the materials in the stripes. It may then be desirable to have the flow 'swept,' meaning that the corners are angled or otherwise machined, cut or formed, to eliminate the abrupt steps. This is discussed in co-pending application "Oblique Angle Micromachining of Fluidic Structures," U.S application Ser. No. 13/019,246.

Figure 3:
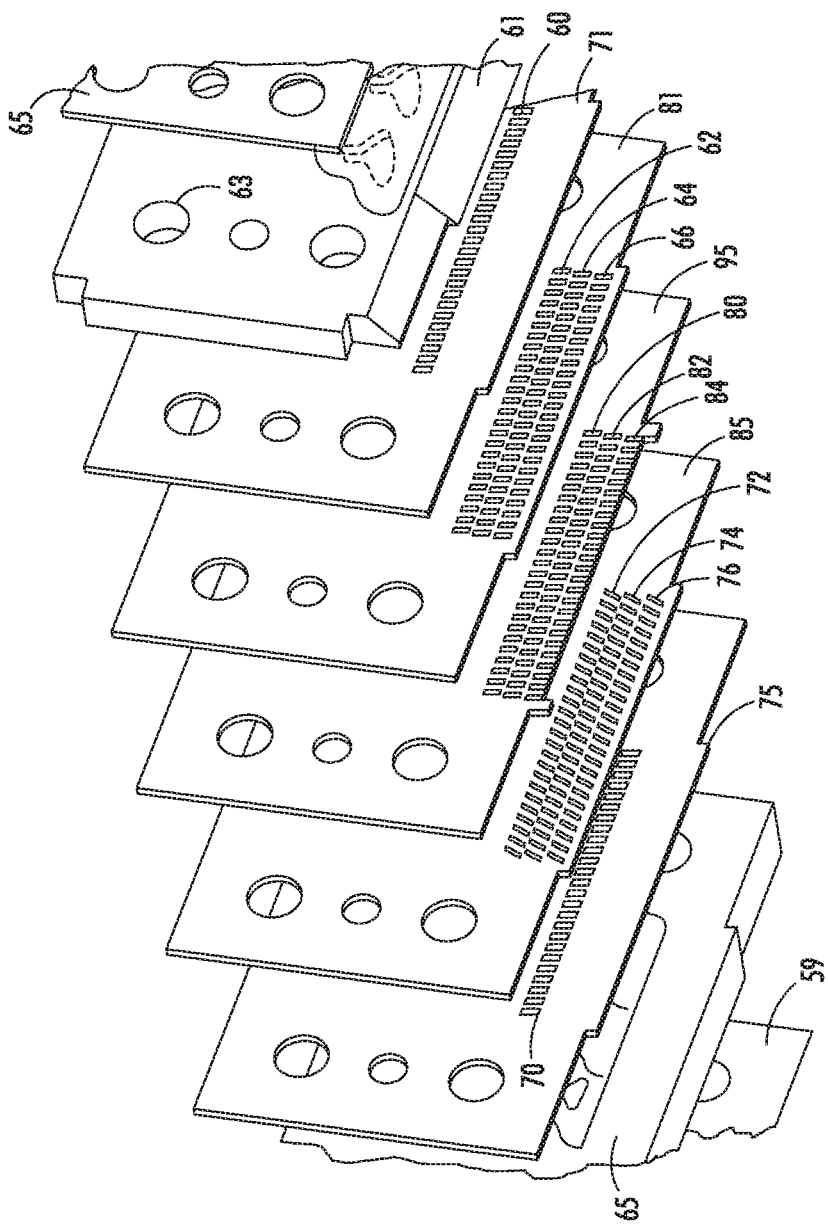
FIG. 3 shows exploded view of an embodiment of a fluid co-extrusion device.

The splitting and combining processes may continue as long as desired within the constraints of the fluids, which may be pastes, to maintain their individual compositions without complete mixing. At each stage of combining and focusing, the line count doubles and the width is decreased for each line by a factor of 2. The cumulative line width reduction is $2^n$, which is the same for the number of lines. From a manufacturing standpoint, it is useful for the device to be assembled from layers fabricated separately and then stacked with an alignment tolerance. The layers are then clamped or bonded together. FIG. 3 shows an embodiment of such a device.

In this embodiment, the device consists of 9 layers. In this particular example, bolts, such as that would use bolt hole 63, clamp the device together through corresponding holes on all of the layers. The two materials enter from opposite sides of the device. However, this is just an example and no limitation to any particular configuration is intended, nor should any be implied. Further, this particular example uses two materials and has 3 cascades repeated 25 times. These all consist of examples to aid in the understanding of the invention and no limitation to any particular configuration is intended nor should it be implied.

A first material enters the device through the sealing plate 63 and enters distribution manifold 61 and the second material enters through the opposite facing sealing plate 59 and enters distribution manifold 65. Each manifold produces a substantially equalized source of fluid pressure to an array of cascades that will perform the fluid folding.

Optional layers 71 and 75 contain series of ports 60 and 70, respectively. These layers provide one entry point for each of the cascades in the device, and may contribute to the equalization of the pressures of the materials entering the cascades. These layers may also be referred to as layers −2 and +2, in order to correspond to the layer reference used above.

On a first fluid folding layer 71, the array of ports 70 conveys a first fluid from its distribution manifold to an array of separation channels 62 on a second fluid folding layer 81. The first fluid is diverted laterally in a first direction on the second fluid folding layer. On a third fluid folding layer 75, an array of ports 70 conveys a second fluid from its distribution manifold to an array of separation channels 72 on a fourth fluid folding layer 85. On the fourth fluid folding layer 85, the second fluid is diverted laterally in a second direction opposite the first direction.

The directions of the separation channels may be flexible. For convenience, in this embodiment all of the separation channels on a given layer all curve in the same direction. Looking at layer 81, for example, the separation channels in arrays 62, 64 and 66 all divert the flows laterally towards the right side of the drawing. These channels could go in different directions, or could all go to the left as well. The same holds true for the separating channels on layer 85 in arrays 72, 74 and 76.

On a fifth fluid folding layer 95, flows from the second and fourth layers are combined and focused into a co-laminar flow by the combining channels in array 80. The flows then split 'vertically' into two flows on the second and fourth folding layers through arrays 64 and 74, respectively. A first combined flow is diverted laterally in the first direction on the second fluid folding layer using array 64. The second combined flow is diverted laterally into an array of separation channels on the fourth fluid folding layer using array 74.

The flows then return to the fifth fluid folding layer 95, where they combine and focus into a second combined, co-laminar flow using array 82. This process repeats n times, each time doubling the number of interdigitated stripes of materials. Downstream of the final stage of the splitting and separating, the flows from all of the cascades are optionally combined together to a common extrusion slot orifice. In the example provided, there are 3 repetitions of the process resulting in 8 interdigitated stripes from each cascade. There are 25 cascades, so the resulting flow will have 200 interdigitated stripes, 100 of each material.

Figure 4:
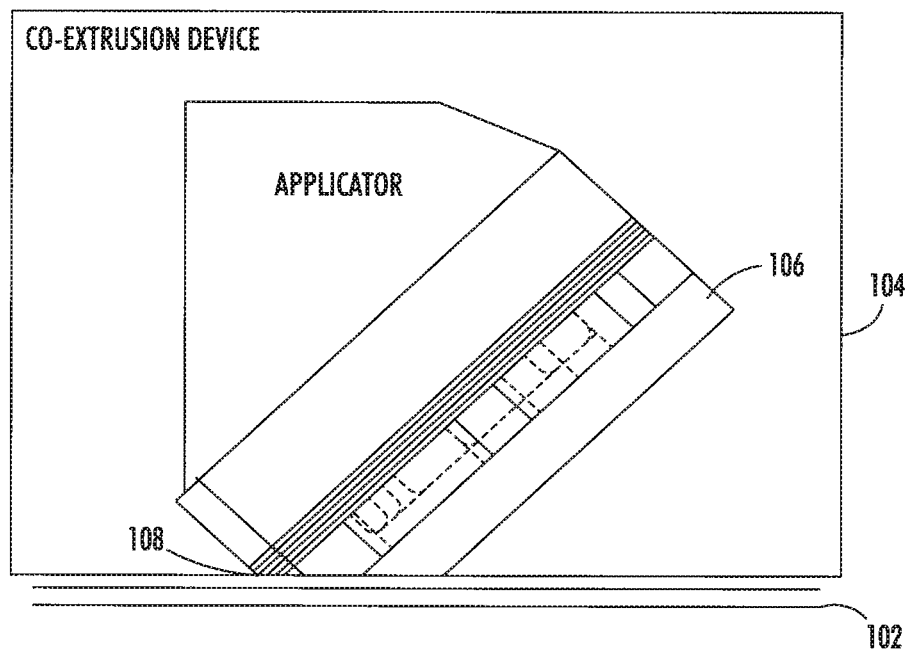
FIG. 4 shows an embodiment of a co-extrusion device and a substrate.

One should note that while the device shown here has the materials arranged on opposite sides of the extruding orifice, the materials could be introduced on the same side of the orifice This co-extrusion device of FIG. 3 can be configured and moved relative to a substrate to deliver the lines of material, as shown in FIG. 4 as device 104. The substrate 102 would be positioned in close proximity to the applicator at a distance that is on the order of 10-1000 microns, referred to as the working distance. The substrate moves relative to the device at a speed comparable to the speed with which fluid exits from the printhead/applicator 106. The co-extrusion device contains the fluid reservoirs as well as the printhead/applicator 106, as well as control and power circuitry. Optionally the fluid reservoirs may be located remotely and fluids delivered to the device as needed through hoses or other plumbing.

In one embodiment, the printhead assembly is configured with components that are chamfered or cut away in such a manner, typically at 45 degrees, that the layered assembly may be held a close proximity to the substrate at a tilted angle. The tilt of the printhead assembly enables a feature that the paste exiting the fluid exit orifice forms an obtuse angle (between 90 and 180 degrees) with the deposited paste on the substrate. This reduces the bending strain on the extruded paste which can aid in the preservation of interdigitated feature fidelity, reduce mixing, and increase print speed.

A co-extrusion device such as that shown in FIGS. 2-4 may be used to form devices that benefit from tightly spaced interdigitated stripes of dissimilar materials including batteries, fuel cells, electrical interconnects and others. In the case of interconnects, vertically stacked integrated circuits may be interconnected along their edges with a series of metal lines separated by insulating spacers. In the case of electrochemical devices such as fuel cells and batteries, the interdigitated structures can enhance performance in a variety of ways. Air cathodes of metal air batteries could be structured to have interdigitated regions of hydrophilic and hydrophobic regions. This will typically exhibit improved oxygen reduction activity, improving the power output of the device.

Figure 5:
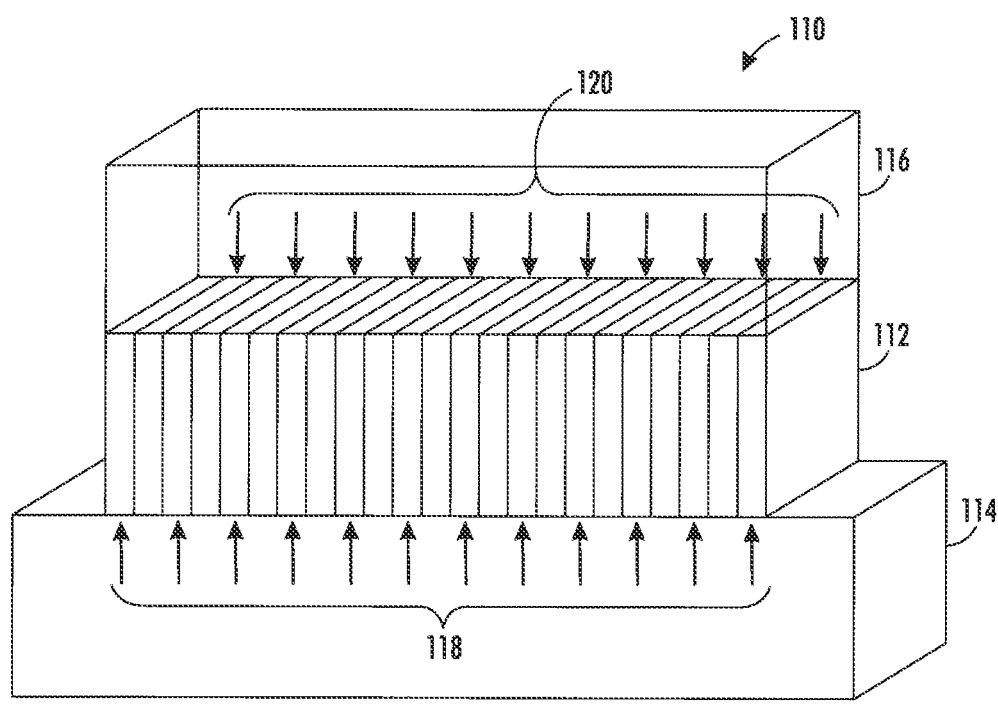
FIG. 5 shows an embodiment of a metal air battery having interdigitated structures.

FIG. 5 shows an example of such a device 110. A hydrophobic membrane 114 has an electrode 112 residing on it. A separator 116 resides on the electrode 112. The electrode in this example consists of interleaved fingers of porous, hydrophobic regions 118 and porous hydrophilic electro-catalyst regions 120. As mentioned above, this can exhibit improved oxygen reduction activity and improve power output. Further, increasing the surface area of the three-phase boundary where the solid catalyst particle, liquid electrolyte and gas-phase reactant interact. For expensive catalysts such as platinum, such structures offer the potential of significant cost reduction.

Figure 6:
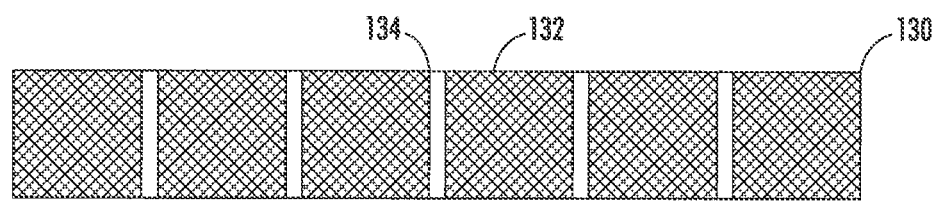
FIGS. 6-11 show embodiments of interdigitated co-extrusions.

FIGS. 6-10 show embodiments of interdigitated co-extrusion structures particularly useful to battery electrode formation. In FIG. 6, the electrode 130 consists of two materials. A first material 132 is an electrode material, such as a cathode or anode active electrode. The material 134 is ionically conductive material, either through solid electrolyte conduction or through porosity. Alternatively, the regions of material 134 may be fugitive or sacrificial material removed during a later drying or firing stage in the manufacturing process. In FIG. 6, the thinner, ionically conductive regions traverse the entire thickness of the electrode layer.

In one embodiment of the formation process for such a feature, the initial flows prior to folding may consist of two flows of material, one of 134 and one of 132. Alternatively, there could be three flows prior to folding, one of material 134 surrounded by flows of 132. This can be important if the two materials interact differently with the walls of the fluidic channels which otherwise could cause lack of symmetry in the combining, mixing and separation of the flows.

One should note that the deposition of the electrically conductive cathode or anode material and the second material onto the membrane result in a structure having interdigitated features of different materials in fluid form. Fluid, as that term is used here, means a gel, a paste, a slurry or a suspension. While these structures may progress through drying or firing stages, they will initially exist in a fluid form.

Further, at least one of these structures will generally have a high aspect ratio. As used here, the aspect ratio means the ratio of the maximum height to the maximum width of a structure or feature. Looking at FIG. 6, one can see that the feature 134 in the interdigitated structure has a high aspect ratio, its height, running in the direction from the top of the page to the bottom, is much larger than its width, running from the left to right across the page. Generally, at least one of the features formed from one of the interdigitated materials will have an aspect ratio greater than 1.

Figure 7:
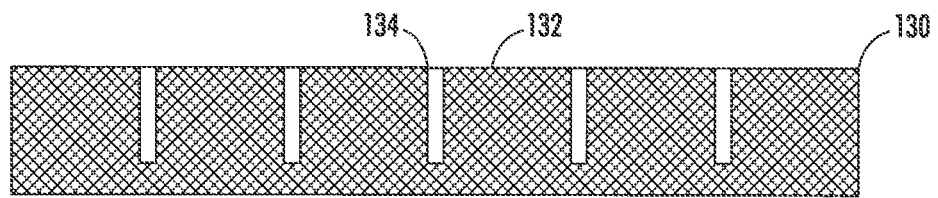

In an alternative embodiment, shown in FIG. 7, the ionically conducting region does not traverse the full thickness of the electrode. This can be formed in two processes, first forming a blanket coat of cathode or anode material followed by an interdigitated coat of the ionically conducting region and the electrode material. A single-step approach would make use of poly-extrusion where the blanket electrode material would be introduced under the ionically conducting material by tailoring the timing of the introduction of the materials into the printhead.

One must note that the proportions of the materials differ greatly, with the cathode or anode material 132 having a much greater width than the ionically conductive material 134. This may occur in many different ways. For example, the input channels, such as 42 and 40 from FIG. 2, may have different sizes. Alternatively, the flow rate of material put into the channels could differ, with much more of the material 132 entering one of the channels than the material 134.

Figure 8:
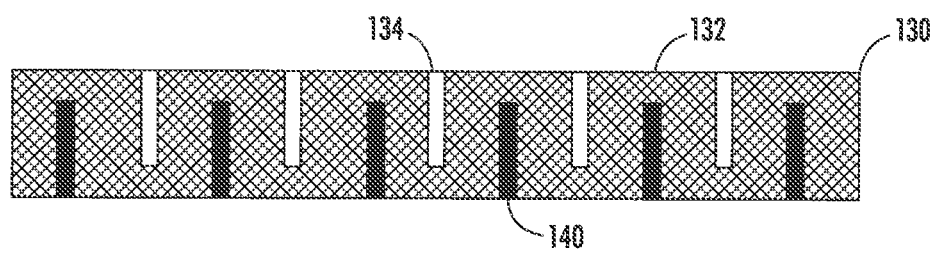

In FIG. 8, a third material is introduced through the printhead, in this case a principally electrically conducting material 140, where the term 'principally' refers to the material having a higher expression of the relevant characteristic than the other materials. The manipulation of materials in the printhead and the subsequent folding processes can be controlled to allow these types of structures to be formed. For example, the three materials can be combined in a three way folding operation to form the central layer of the structure and two layer folding can be performed prior to and subsequent to the application of the central layer. This can be performed with three sequential applicators or unified in a single applicator which executes all three folding operations. In this embodiment it will be important to align the fluidic layers so that the features in FIG. 9 are continuous through the extruded structure.

Figure 9:
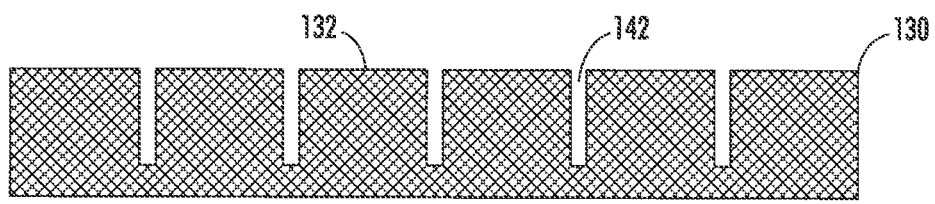
Figure 10:
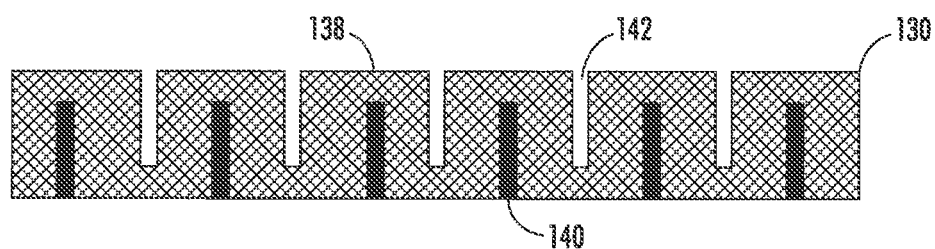

FIG. 9 shows a structure similar to that of FIG. 7, where the material 134 was a fugitive material, removed after printing leaving a gap such as 142. FIG. 10 shows an embodiment similar to FIG. 8, with the fugitive material removed leaving gaps 142, and having the principally electrically conducting material 140. These gaps could be subsequently filled with electrolyte material such as a liquid electrolyte to make substantially ionically conducting regions within the electrode structure.

These gaps could also subsequently be filled with the opposite of the cathode or anode material and a spacer material which prevents electrical contact of the anode and cathode materials but allows ionic transport between the electrodes, forming the opposing electrodes of an electrochemical cell such as a battery with alternating cathode and anode regions. Alternatively these gaps could be filled with a second electrode material and spacer material forming the opposing electrodes of an electrolytic capacitor or supercapacitor.

Figure 11:
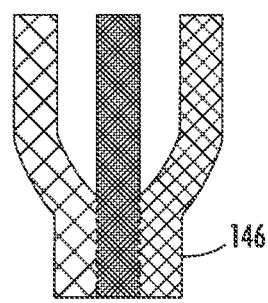

One alternative mentioned previously in the discussion involved flowing three materials. Referring back to FIG. 2, one can see a possibility of altering the initial flow. Instead of having only two input channels 40 and 42 in to the combining channel 46, one could have three or more input channels. An example of this is shown by combination channel 146 in FIG. 11. In FIG. 11, the combination channel has 3 input channels, allowing combination of 3 materials. From this point forward in the process, the remaining structure would be the same. Instead of folding two-material flows, however, the remaining structures would fold three-material flows. More than 3 input channels could also be used; this merely provides an example of more than 2 materials.

In this manner, interdigitated structures having micron features on a micron scale can be formed using a co-extrusion device. The co-extrusion device may take the form of a printhead, allowing faster formation of the structures using printing techniques.

It will be appreciated that several of the above-disclosed and other features and functions, or alternatives thereof, may be desirably combined into many other different systems or applications. Also that various presently unforeseen or unanticipated alternatives, modifications, variations, or improvements therein may be subsequently made by those skilled in the art which are also intended to be encompassed by the following claims

What is claimed is:

1. A co-extrusion device, comprising:
a first layer of material having at least one array of separating channels and at least one array of splitting channels, the separating channels and the splitting channels having entrances and exits, the first layer of material arranged to receive a first material;
a second layer of material arranged adjacent the first layer of material, the second layer of material having at least one array of combining channels and at least one array of extruding orifices, the combining channels having entrances and exits;
a third layer of material, arranged adjacent a side of the second layer of material opposite the first layer of material such that the second layer of material lies between the first and third layers of material, the third layer of material is arranged to receive a second material;
the exits of the separating channels being aligned with the entrances of the combining channels;
the exits of the combining channels being aligned with the entrances of the splitting channels; and
the exits of the splitting channels being aligned with the entrances of one of either another array of combining channels or an array of extruding orifices such that the first and second materials exit the extruding orifices to form interleaved stripes of the first and second materials without mixing the first and second materials;
wherein a first flow path begins at one of the separating channels in the first layer, enters a first of the combining channels in the second layer, returns to a first of the splitting channels in the first layer, ending at one of the extruding orifices in the second layer, the layers of material comprising plates stacked together, such that the first flow path passes through a plate forming the first layer in a first direction, passes through a plate forming the second layer in a direction opposite to the first direction to return to the plate forming the first layer; and
wherein the third layer of material forms a second flow path that begins in a separating channel in the third layer of material, enters a first of the combining channels of the second layer, returns to a first of the splitting channels in the third layer, ending at one of the extruding orifices in the second layer.

2. The co-extrusion device of claim 1, further comprising a first distribution manifold arranged adjacent the first layer of material and a second distribution manifold is arranged adjacent the third layer of material, each distribution manifold arranged to deliver a different material from the other distribution manifold.

3. The co-extrusion device of claim 1, further comprising a print head.

4. The co-extrusion device of claim 1, wherein the first layer of material comprises one array of separating channels and two arrays of splitting channels.

5. The co-extrusion device of claim 1, wherein the second layer of material comprises two arrays of combining channels and one array of extruding orifices.

6. The co-extrusion device of claim 1, wherein the combining channels further comprising combining and focusing channels having a lateral extent in a combining region approximately the same as a lateral extent of a region prior to the combining region.

* * * * *